(12) United States Patent
Varanasi et al.

(10) Patent No.: US 8,839,069 B2
(45) Date of Patent: Sep. 16, 2014

(54) ENCODING AND DECODING TECHNIQUES USING LOW-DENSITY PARITY CHECK CODES

(75) Inventors: Chandra C. Varanasi, Broomfield, CO (US); Guiqiang Dong, Troy, NY (US)

(73) Assignee: Micron Technology, Inc., Boise, ID (US)

( * ) Notice: Subject to any disclaimer, the term of this patent is extended or adjusted under 35 U.S.C. 154(b) by 651 days.

(21) Appl. No.: 13/083,341

(22) Filed: Apr. 8, 2011

(65) Prior Publication Data

US 2012/0260144 A1    Oct. 11, 2012

(51) Int. Cl.
*H03M 13/00* (2006.01)
*H04L 1/00* (2006.01)
*H03M 13/11* (2006.01)

(52) U.S. Cl.
CPC ............ *H04L 1/0057* (2013.01); *H04L 1/0045* (2013.01); *H03M 13/1182* (2013.01); *H03M 13/1174* (2013.01); *H03M 13/1151* (2013.01); *H03M 13/1162* (2013.01); *H03M 13/1165* (2013.01); *H03M 13/611* (2013.01)
USPC ........................................................ 714/758

(58) Field of Classification Search
USPC ........................................................ 714/758
See application file for complete search history.

(56) References Cited

U.S. PATENT DOCUMENTS

| | | | |
|---|---|---|---|
| 6,895,547 B2 | 5/2005 | Eleftheriou et al. | |
| 2007/0113142 A1 | 5/2007 | Eroz et al. | |
| 2008/0222486 A1 | 9/2008 | Richardson et al. | |
| 2008/0288846 A1 * | 11/2008 | Kyung et al. | 714/752 |
| 2009/0089642 A1 | 4/2009 | Miles et al. | |
| 2009/0210767 A1 | 8/2009 | Myung et al. | |
| 2009/0217123 A1 * | 8/2009 | Dore et al. | 714/752 |
| 2009/0313524 A1 | 12/2009 | Choi et al. | |
| 2010/0100790 A1 | 4/2010 | Sutskover | |
| 2010/0138720 A1 | 6/2010 | Myung et al. | |
| 2010/0153813 A1 | 6/2010 | Myung et al. | |

FOREIGN PATENT DOCUMENTS

| | | | |
|---|---|---|---|
| WO | WO-2012138662 A2 | 10/2012 | |
| WO | WO-2012138662 A3 | 10/2012 | |

OTHER PUBLICATIONS

"International Application Serial No. PCT/US2012/032013, International Preliminary Report on Patentability mailed Oct. 17, 2013", 5 pgs.
"International Application Serial No. PCT/US2012/032013, Search Report mailed Oct. 31, 2012", 4 pgs.
"International Application Serial No. PCT/US2012/032013, Written Opinion mailed Oct. 31, 2012", 3 pgs.

* cited by examiner

*Primary Examiner* — Albert Decady
*Assistant Examiner* — Enam Ahmed
(74) *Attorney, Agent, or Firm* — Schwegman Lundberg & Woessner, P.A.

(57) ABSTRACT

Some embodiments include apparatus and methods for encoding message information. Such apparatus and methods can include using a parity check matrix of a low-density parity check (LDPC) code to generate a first matrix having an upper triangular sub-matrix. Parity information to encode the message information can be generated based on the first matrix if a total number of rows of the upper triangular sub-matrix is equal to the rank of the parity check matrix. If the total number of rows of the upper triangular sub-matrix is less than the rank of the parity check matrix, then a triangularization operation can be performed on a second sub-matrix of the first matrix to generate a second matrix. Parity information to encode the message information can be generated based on the second matrix. Other embodiments including additional apparatus and methods are described.

42 Claims, 5 Drawing Sheets

ENCODING AND DECODING TECHNIQUES USING LOW-DENSITY PARITY CHECK CODES

BACKGROUND

Many electrical devices and systems exchange information with each other via transmission media, such as metal conductors, fiber optic cables, and air. An inferior or defective transmission medium may cause errors in such information. Exceeding transmission capability (e.g., transmission rate) of the medium can also induce errors. In some situations, the errors can be corrected. Many conventional techniques use codes to check the validity of information after it is received. Some codes may also assist in correcting the errors. For example, a low-density parity check (LDPC) code can be used for error corrections. In some conventional techniques, however, using an LDPC code may involve complex coding operations or may demand a large number of circuit components to operate. Thus, an LDPC code can be unsuitable for some devices or systems.

DETAILED DESCRIPTION

Figure 1:
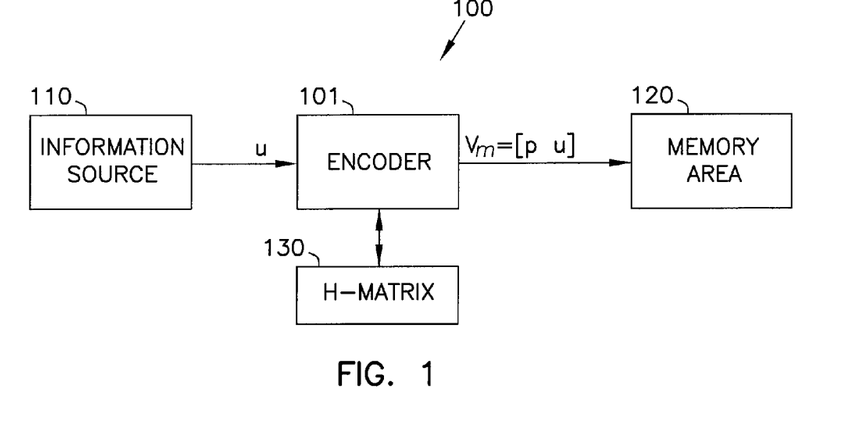
FIG. 1 shows a block diagram of an apparatus including an encoder configured to encode message information with respect to an LDPC code to form codewords, according to an embodiment of the invention.

FIG. 1 shows a block diagram of an apparatus 100 including an encoder 101 configured to encode message information u with respect to an LDPC code to form codewords $V_m$, according to an embodiment of the invention. Apparatus 100 can include an information source 110 to provide message information u and a memory area 120 to receive codewords $V_m$, from encoder 101. Information source 110 can be provided by devices such as a memory controller or a processor. Memory area 120 can include a memory array to store codewords $V_m$. Encoder 101 and memory area 120 can be included in a same device, such as a memory device or a memory controller. Apparatus 100 may include a memory module, a system or device capable of transmitting and receiving information wirelessly, and/or other communication systems and devices having ability to provide error correction in information transmission. FIG. 1 omits additional details of apparatus 100 to focus on the embodiments described herein.

Encoder 101 can be realized in the form of an LDPC encoder that generates codewords $V_m$, from message information u with respect to an H-matrix 130. H-matrix 130 can be stored internally in apparatus 100 or external to apparatus 100. H-matrix 130 can include parity check matrix H of a LDPC code. As is understood by those skilled in the art, an H-matrix, such as H-matrix 130, of a code used in transmitting information can be generated (e.g., constructed) using various code constructions, such as a progressive edge-growth LDPC code construction, a Reed Solomon LDPC code construction, LDPC code constructions based on Euclidian geometries, LDPC code constructions based on Vandermondematrix and cyclic permutation blocks, and various other LDPC constructions. An H-matrix, such as H-matrix 130, can be generated by a computer.

FIG. 1 shows codewords $V_m=[p\ u]$ to indicate that codewords $V_m$ can be systematic codewords containing a combination of parity information p and message information u. Message information u can include a number of information bits. Parity information p can include a number of parity bits. Codewords $V_m=[p\ u]$ can be defined by H-matrix 130 where message bits of message information u can correspond to a portion of the columns of H-matrix 130 and parity bits of parity information p can correspond to another portion of the columns of H-matrix 130. FIG. 1 shows an example of codewords $V_m=[p\ u]$ where parity information p is located in the first codeword position followed by message information u. The order can be reversed. Message information u can be located in the first codeword position followed by parity information p, such that codewords $V_m=[u\ p]$.

In apparatus 100, since message information u is known, with a given H-matrix of a code, such as H-matrix 130, encoding operations performed by encoder 101 involves generating parity information p based on received message information u and the given H-matrix. Then, encoder 101 can combine received message information u with the generated parity information p to form codewords $V_m=[p\ u]$. Decoding codewords $V_m$ to retrieve the original message information u can be done in a reversed order. For example, encoding processes (e.g., steps) performed during encoding to generate parity information p can be performed on codewords $V_m$ in a reversed order to generate decoded information. Then, the same H-matrix used for encoding can be used during decoding to generate the original message information u based on the decoded information. The description herein focuses on encoding to generate codewords $V_m=[p\ u]$ based on received message information u and a given H-matrix of an LDPC code, as described in detail with reference to FIG. 2 through FIG. 7.

Figure 2:
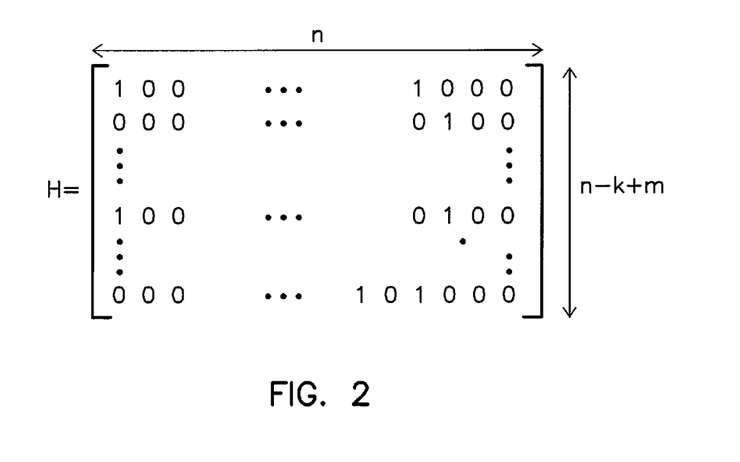
FIG. 2 shows an example of a parity check matrix H of an LDPC code, according to an embodiment of the invention.

FIG. 2 shows an example of a parity check matrix H of an LDPC code. Matrix-H is arranged in rows and columns and has a size (n−k+m)×(n), which corresponds to (n−k+m) rows and n columns. Parameter m corresponds to the number of dependent rows of matrix-H. The rank of a matrix is the number of dependent rows of that matrix. Thus, if matrix-H is a full-rank matrix, parameter m=0. If matrix-H is a rank-deficient (e.g., not a full-rank) matrix, parameter m>0. Parameter n is the number of code bits in a codeword. Parameter k is the number of information bits in a codeword. Thus, in each row (each codeword) of matrix-H, there are n total code bits formed by a combination of k information bits and n−k parity bits.

As shown in FIG. 2, matrix-H is an example of a binary matrix having only zeros ("0") and ones ("1") entries. LDPC codes use a parity check matrix H containing mostly zeros and a limited number of ones. For simplicity, FIG. 1 shows only some of the entries of matrix-H. Based on a parity check matrix H, such as matrix-H in FIG. 1, an encoder (e.g., encoder 101 in FIG. 1) described herein can generate parity information associated with message information in order to generate codewords that includes a combination of the parity information and the message information.

Figure 3:
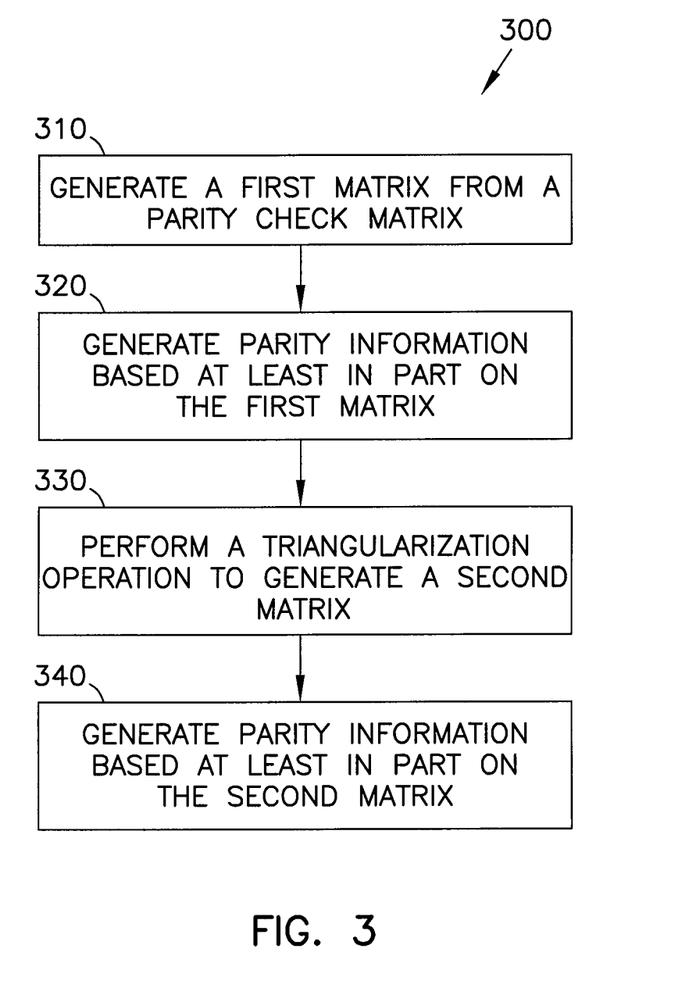
FIG. 3 is a flowchart of a method of encoding information based on a parity check matrix H of an LDPC code, according to an embodiment of the invention.

FIG. 3 is a flowchart of a method 300 of encoding information based on a parity check matrix H of an LDPC code, according to an embodiment of the invention. The parity check matrix H used in method 300 can include matrix-H of an LDPC code described above with reference to FIG. 1 and FIG. 2.

In FIG. 3, method 300 can include an activity 310 to generate a first matrix (e.g., $H_m$) from the parity check matrix H (e.g., matrix-H in FIG. 1 and FIG. 2). The first matrix can be generated such that it has an upper triangular sub-matrix in the top-left corner of the first matrix. Activity 310 can also include calculating the rank of the parity check matrix H that used to generate the first matrix.

If the total number of rows of the upper triangular sub-matrix is equal to the rank of the parity check matrix H, method 300 can include activity 320 to generate parity information to encode message information based at least in part on the first matrix. Method 320 may stop after performing activity 320.

If the total number of rows of the first upper triangular sub-matrix is less than the rank of the parity check matrix H, method 300 may continue with activity 330 to perform an upper triangularization operation on a second sub-matrix of the first matrix to generate (e.g., form) a second matrix (e.g., $H_{m2}$). Activity of 340 of method 300 can generate parity information to encode message information based at least in part on the second matrix.

Some or all of activities 310, 320, 330, and 340 of method 300 can be performed by a processor of an electronic unit, such as a computer. For example, activities 310, 320, and 330 can be performed by a computer. Some or all of activities 310, 320, 330, and 340 of method 300 can also be performed by an encoder, such as encoder 101 of FIG. 1. Such encoder can be included in a device, such as a processor, a memory controller, or a memory device. Method 300 may include one or more activities described below reference to FIG. 4 through FIG. 7.

Figure 4:
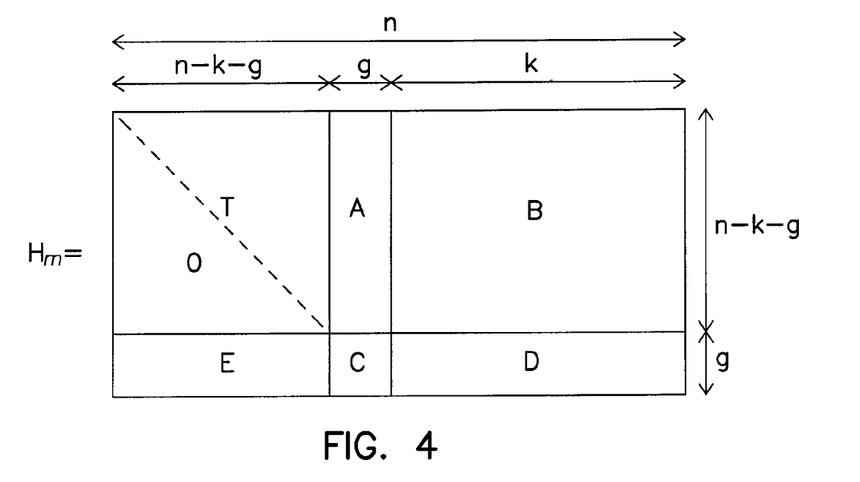
FIG. 4 shows a block structure of a matrix generated from a parity check matrix H of an LDPC code, according to an embodiment of the invention.

FIG. 4 shows a block structure of a matrix $H_m$ generated from a parity check matrix H of an LDPC code, according to an embodiment of the invention. Matrix $H_m$ can be generated from a parity check matrix H of an LDPC code, such as matrix-H in FIG. 1 or FIG. 2. An encoder described herein (e.g., encoder 101 in FIG. 1) can receive message information and use matrix $H_m$ to generate codewords having parity information and the received message information.

Traditionally, a generator matrix $G_m$ is used to encode message information. For example, a matrix $H=[I_{n-k}|P]$ can be generated from a matrix-H, where $I_{n-k}$ is an identity sub-matrix, P is a sub-matrix of the matrix G. Then, a matrix $G_m$ can be generated from the matrix G, such that $G_m=[P^T|I_k]$ where $P^T$ denotes a transpose of sub-matrix P. The codewords=$u*G_m$ can be generated, the symbol "*" in this equation denotes multiplication. Thus, in a traditional encoding, generator matrix $G_m$ is used to encode message information. The traditional way, however, can be complex and unsuitable for some systems or devices. For example, a large number of circuit components, e.g., exclusive-OR (XOR) gates, may be needed to process and store information associated with generator matrix $G_m$ or both generator matrix $G_m$ and matrix-H.

The encoder described herein can generate the codewords directly from matrix $H_m$, without generating a matrix such as the traditional generator matrix $G_m$. The encoder that generates the codewords based on matrix $H_m$ as described herein may be less complex and may have a reduced the number of components, e.g., exclusive-OR gates.

As shown in FIG. 4, matrix $H_m$ includes sub-matrices T, A, B, E, C, and D located in various portions of matrix $H_m$. For example, sub-matrix T is located in a top-left corner portion of matrix $H_m$. Sub-matrix B is located in a top-right corner portion of matrix $H_m$. Sub-matrix A is located in a middle portion of matrix $H_m$ between sub-matrix T and sub-matrix B. Sub-matrix E is located in a bottom-left corner portion of matrix $H_m$ below sub-matrix T. Sub-matrix D is located in a bottom-right corner portion of matrix $H_m$. Sub-matrix D is located in a middle portion of matrix $H_m$ between sub-matrix E and sub-matrix D and below sub-matrix A. The sizes of these sub-matrices are as follows.

$T:(n-k-g)\times(n-k-g)$.

$A:(n-k-g)\times g$.

$B:(n-k-g)\times k$.

$C:g\times g$.

$D:g\times k$.

$E:g\times(n-k-g)$.

Matrix $H_m$ can be generated by performing a process known as greedy upper triangularization operation. This operation generates an upper triangular matrix, which is sub-matrix T, in the top-left corner of matrix $H_m$. This operation involves exchanging only rows, exchanging only columns, or exchanging only rows and columns of the parity check matrix H. No arithmetic operations (e.g., no Gaussian elimination operations) on the rows of the parity check matrix H are performed in this operation.

Sub-matrix T is a square upper triangular matrix having (n-k-g) rows and (n-k-g) columns. Sub-matrix T has all ones in its diagonal entries and all zeros below its diagonal entries. If the number of rows of sub-matrix T is equal to the rank R of parity check matrix H, then parameter g=0 in matrix $H_m$, such that (n-k-g)=R where g=0. Also, if g=0, then sub-matrices A is eliminated and become part of sub-matrix B, and sub-matrices E, C, and D are eliminated and become parts of sub-matrix T and sub-matrix B. In this case (n-k=R), matrix $H_m=[T|B]$, in which sub-matrix T has a size (n-k=R)×(n-k=R) and sub-matrix B has a size (n-k=R)×k.

When an encoder, such as encoder 101 in FIG. 1, uses matrix $H_m$ to generate codewords $V_m=[p\ u]$, where u denotes message information, the parity information (p) can be generated as follows (for g=0). For matrix $H_m$, a syndrome of valid codewords $V_m$ is an all-zero vector of a size n-k, such that equation $H_m * V_m^T=0$ is satisfied. Since $H_m=[T|B]$ and $V_m=[p\ u]$, by substituting $V_m^T=[p\ u]^T$ into equation $H_m*V_m^T=0$, the following equation can be obtained.

$$[T\ B]\begin{bmatrix}p\\u\end{bmatrix}=0$$

Solving the above equation yields Equation (1) below:

$Tp=Bu$, thus $p=T^{-1}Bu$.   (Equation 1)

An encoder, such as encoder 101 of FIG. 1, can be configured to generate parity information p of codewords $V_m$. Thus, for a given parity check matrix H of an LDPC code, matrix $H_m$ shown in FIG. 4 can be generated. If the total number of rows of sub-matrix T of matrix $H_m$ is equal to the rank R of the parity check matrix H, then the encoder can be configured to generate parity information p based on Equation (1). The parity information can be combined with received message information u to generate codewords $V_m$=[p u]. Since an encoder described herein can generate codewords $V_m$ based on Equation (1) if the total number of rows of sub-matrix T of matrix $H_m$ is equal to the rank R of the parity check matrix H, the encoder may store (e.g., store in a memory) only matrix $H_m$ (and not the parity check matrix H) and $T^{-1}$ for encoding because other values, e.g., B and u, are available from matrix $H_m$ and from message information u. During encoding, the encoder may access a memory to retrieve the stored entries of $T^{-1}$ and matrix $H_m$ to generate parity information p based on Equation (1) and generate codewords $V_m$=[p u].

If the total number of rows of sub-matrix T of matrix $H_m$ is less than the rank R of the parity check matrix H, additional operations can be performed on matrix $H_m$ of FIG. 4 to generate the parity information, as described below with reference to FIG. 5 and FIG. 6.

As described above with reference to FIG. 4, matrix $H_m$ can be generated by exchanging only rows or columns, or both, of the parity check matrix H. The process used to generate matrix $H_m$ may also include generating (e.g., creating) a tracking record (e.g., a map). This tracking record can track (e.g., map) position numbers of rows or columns of the parity check matrix H that have been exchanged during the generation of matrix $H_m$. Since sub-matrix T of matrix $H_m$ is generated by exchanging columns of the parity check matrix H, the tracking record also contains a link between a position number of at least one column of the sub-matrix T and a position number of at least one column of the parity check matrix H.

The tracking record can be used during decoding of codewords $V_m$ to obtain the original message information u. For example, during decoding, operations such as a deinterleaving operation can be performed. Such operations can exchange the columns of codewords $V_m$ based on the tracking record, but in a reversed order, to generate codewords V, which are not in systematic form. A decoder can be used to decode codewords V using the parity check matrix H to generate the original message information u.

During the upper triangularization operation to generate sub-matrix T of matrix $H_m$, the columns of the parity check matrix H can be randomly selected to generate the columns of sub-matrix T. This random selection may increase a probability of sub-matrix T having a size R×R, where R is the rank of the parity check matrix H. The total number of rows of sub-matrix T is equal to R when sub-matrix T has a size R×R. If the size of sub-matrix T is R×R, then matrix $H_m$ can have a full triangular structure, e.g., $H_m$[T|B], where parameter g in FIG. 4 is equal to zero (e.g., n−k=R). As described above with reference to FIG. 4, Equation 1 can be used in an encoder in the case where sub-matrix T has a size R×R.

In some case, depending on the value of the entries of the parity check matrix H, the upper triangularization operation may unsuccessfully generate sub-matrix T having a size R×R (e.g., the total number of rows of sub-matrix T is less than R). In such case, matrix $H_m$ does not have full triangular structure but it has an approximate triangular structure, as shown in FIG. 4, where parameter g is not zero. In this case, Equation (1) may be inapplicable for generating the parity information. However, additional operations can be performed on matrix $H_m$ to generate matrix $H_{m1}$ (FIG. 5) and matrix $H_{m2}$ (FIG. 6). The parity information can be generated based on matrix $H_{m2}$.

Figure 5:
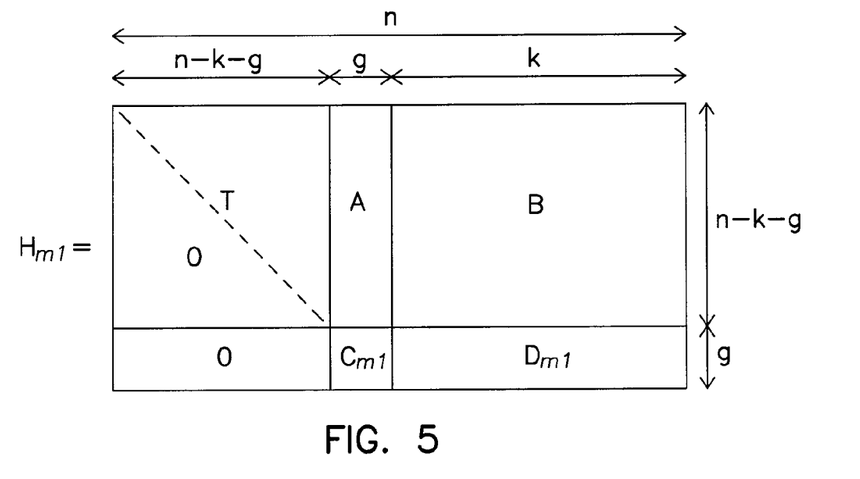
FIG. 5 and FIG. 6 show block structures of matrices generated from the matrix of FIG. 4, according to an embodiment of the invention.
Figure 6:
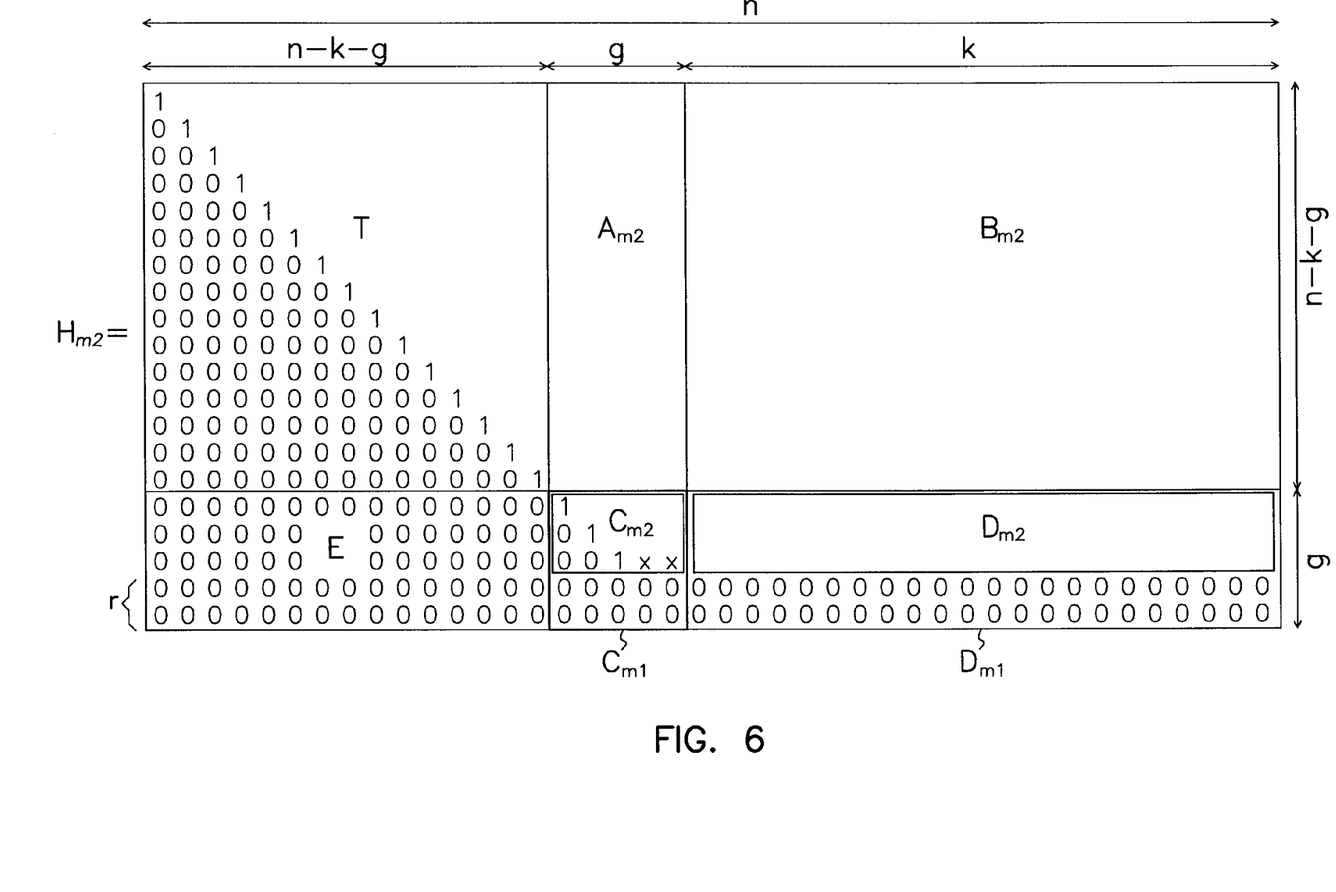

FIG. 5 and FIG. 6 show block structures of matrix $H_{m1}$ and $H_{m2}$, respectively, generated from matrix $H_m$ of FIG. 4, according to an embodiment of the invention. Codewords $V_m$ can be generated using matrix $H_{m2}$ of FIG. 6, as described below after the description of matrix $H_{m1}$ of FIG. 5.

As shown in FIG. 5, matrix $H_{m1}$ has the same block structure as that of matrix $H_m$ of FIG. 4. However, the values of entries of sub-matrices E, $C_{m1}$, and $D_{m1}$ of matrix are $H_{m1}$ of FIG. 5 are different from those of corresponding sub-matrices E, C, and D of matrix $H_m$ of FIG. 4. As shown in FIG. 5, all entries of sub-matrix E are zeros ("0"). Sub-matrices $C_{m1}$ and $D_{m1}$ may be less sparse (more dense) than corresponding sub-matrices C and D of FIG. 4, due to operations performed on sub-matrix E to make all of its entries zeros. Such operations can include arithmetic operations, e.g., Gaussian elimination operations. Since the rows of sub-matrices E, C, and D are parts of the same rows of matrix $H_m$, the operations performed on the rows of sub-matrix E of matrix $H_m$ also modify the rows of sub-matrices C and D of matrix $H_m$. Thus, after all entries of sub-matrix E become zeros, sub-matrices C and D in FIG. 4 become sub-matrices $C_{m1}$ and $D_{m1}$ in FIG. 5.

FIG. 6 shows a block structure of a matrix $H_{m2}$ generated from matrix $H_{m1}$, according to an embodiment of the invention. From matrix $H_{m2}$, calculations can be performed to obtain equations to generate parity information for codewords $V_m$. As shown in FIG. 6, matrix $H_{m2}$ has the same block structure as that of matrix $H_m$ of FIG. 5. However, matrix $H_{m2}$ can include a number of rows r having all zeros entries. The specific number of rows and columns matrix $H_{m1}$ and the specific sizes of each of sub-matrices of matrix $H_{m1}$ shown in FIG. 6 are only for illustration purposes to help focus on the description herein.

As described above with reference to FIG. 4, an upper triangularization operation can be performed on the parity check matrix H to generate the upper triangular sub-matrix T (as shown in FIG. 6). In FIG. 5 and FIG. 6, an additional upper triangularization operation can be performed on sub-matrix $C_{m1}$ to make the diagonal of sub-matrix $C_{m1}$ to have as many ones ("1") as possible. The additional upper triangularization operation may not cause all entries in diagonal of sub-matrix $C_{m1}$ to have values of ones. However, the additional upper triangularization operation may cause at least one entry in the diagonal of sub-matrix $C_{m1}$ to have a value of one. For example, as shown in FIG. 6, the additional upper triangularization operation may cause three out of five entries in the diagonal of sub-matrix $C_{m1}$ to have values of ones. Entries x in sub-matrix $C_{m1}$ can be either one or zero. The additional upper triangularization operation may stop when no additional ones can be form in the diagonal of sub-matrix $C_{m1}$, such as in the case shown in FIG. 6. The additional upper triangularization operation may also cause one or more of rows at the bottom of sub-matrix $D_{m1}$ to have values of zeros. The additional upper triangularization operation generates matrix $H_{m2}$. As shown in FIG. 6, matrix $H_{m2}$ has a number of rows r with all entries having zeros. FIG. 6 shows r=2 as an example. The value of r can vary.

These r rows, having entries with all zeros, correspond to dependent rows in the parity check matrix H. Thus, the r rows can be removed from matrix $H_{m2}$. Therefore, after the r rows are removed, matrix $H_{m2}$ can have fewer rows (fewer by r rows) than matrix $H_{m1}$.

The additional upper triangularization operation performed on sub-matrix $C_{m1}$ can include any combination of exchanging rows, exchanging columns, and arithmetic operations (e.g., Gaussian elimination operations). As a comparison, the upper triangularization operation performed on parity check matrix H to generate triangular sub-matrix T (FIG. 4) may include no arithmetic operations (e.g., exchanging only rows and columns).

The additional upper triangularization operation performed on sub-matrix $C_{m1}$ can also modify the rows and columns of sub-matrices A, B, $C_{m1}$, and $D_{m1}$. Thus, after the additional upper triangularization operation, sub-matrices A, B, $C_{m1}$, and $D_{m1}$ of matrix $H_{m1}$ (FIG. 5) become sub-matrices $A_{m2}$, $B_{m2}$, $C_{m2}$, and $D_{m2}$ of matrix $H_{m2}$ of FIG. 6.

When an encoder, such as encoder 101 in FIG. 1, uses matrix $H_{m2}$ to generate codewords $V_m = [p\ u]$, where u denotes message information, parity information p can be generated as follows.

As described above with reference to FIG. 4, FIG. 5, and FIG. 6, matrix $H_{m2}$ is generated from matrix $H_{m1}$, which in turn is generated from matrix $H_m$ (FIG. 4). Since matrix $H_m$ has an approximate triangular structure (where parameter g is not zero), parity information p of the systematic codeword of $V_m = [p_m\ u]$ can be viewed as consisting of two portions: a (n−k−g)-bit long parity portion $p_1$ and a g-bit long parity portion $p_2$. Thus, $p = [p_1\ p_2]$, therefore $V_m = [p\ u] = [p_1\ p_2\ u]$.

For matrix $H_{m2}$, a syndrome of valid codewords $V_m$ is an all-zero vector of a size n−k, such that equation $H_{m2} * V_m^T = 0$ is satisfied.

Since $V_m = [p_1\ p_2\ u]$, $V_m^T = [p_1\ p_2\ u]^T$. As shown in FIG. 6, $$H_{m2} = \begin{bmatrix} T & A_{m2} & B_{m2} \\ 0 & C_{m2} & D_{m2} \end{bmatrix},$$

by replacing $V_m^T = [p_1\ p_2\ u]^T$ into equation $H_{m2} * V_m^T = 0$, the following equation can be obtained.

$$\begin{bmatrix} T & A_{m2} & B_{m2} \\ 0 & C_{m2} & D_{m2} \end{bmatrix} \begin{bmatrix} p_1 \\ p_2 \\ u \end{bmatrix} = \begin{bmatrix} 0 \\ 0 \end{bmatrix}$$

Solving the above equation yields Equation (2) and Equation (3) below.

$C_{m2} p_2 = D_{m2} u$. Thus, $p_2 = (C_{m2}^{-1} D_{m2})$ $T p_1 = (A_{m2} p_2 + B_{m2} u)$. Thus, $p_1 = T^{-1}(A_{m2} p_2 + B_{m2} u)$.  (Equation 2)

Substituting $p_2 = (C_{m2}^{-1} D_{m2})$ from Equation (2) into equation $p_1 = T^{-1}(A_{m2} p_2 + B_{m2} u)$ yields Equation (3).

$p_1 = T^{-1}(A(C_{m2}^{-1} D_{m2}) + B_{m2} u)$  (Equation 3)

Based on Equation (2) and Equation (3), an encoder, such as encoder 101 of FIG. 1, can be configured to generate parity information p of codewords $V_m$. Thus, for a given parity check matrix H of an LDPC code, matrix $H_{m2}$ shown in FIG. 6 can be generated. Then, based on matrix $H_{m2}$, Equation (2) and Equation (3) can be calculated to generate parity information $p_1$ and $p_2$. The encoder can combine parity information $p_1$ and $p_2$ with received message information u to generate codewords $V_m = [p_1\ p_2\ u]$.

The process used to generate matrices $H_{m1}$ and $H_{m2}$, as described above, may also include generating (e.g., creating) a tracking record (e.g., a map). This tracking record can track position numbers of rows or columns of the parity check matrix H that have been exchanged during the generation of matrices $H_{m1}$ and $H_{m2}$. For example, this tracking record can track the position numbers of rows or columns of the parity check matrix H that have been exchanged during both the operations to make all entries of sub-matrix E zeros and the triangularization operations performed on sub-matrix matrix $C_{m1}$. This tracking record can also link (e.g., map) position numbers of rows or columns of the parity check matrix H that have been exchanged during the generation of matrices $H_{m1}$ and $H_{m2}$. Thus, this tracking record also contains a link between the position numbers of the columns of matrix $H_{m2}$ and the position numbers of the columns of parity check matrix H.

The combination of the tracking record generated during the generation of matrices $H_{m1}$ and $H_{m2}$ (FIG. 5 and FIG. 6) and the tracking record generated during the generation of matrix $H_m$ (FIG. 4) can be used together with the parity check matrix H during decoding of codewords $V_m$ to obtain the original message information u. The generation of matrices $H_m$, $H_{m1}$, and $H_{m2}$ and associated activities, such as generation of tracking record and Equations 1, 2, and 3, can be performed by an electronic unit, such as a computer. For example, such electronic unit may receive input information associated with parity check matrix H. Then, based on the input information, the electronic unit may generate output information, such as matrices $H_m$, $H_{m1}$, and $H_{m2}$, tracking record, and Equations 1, 2, and 3.

As described above, an encoder described herein can generate codewords $V_m$ based on Equations (2) and (3). Multiplications in the parameters in Equations (2) and (3) can be obtained by operations such as exclusive-OR additions. Thus, the encoder may store only matrix $H_{m2}$ (and not the parity check matrix H) and the product $C_{m2}^{-1} D_{m2}$ because other values, e.g., A, B, and u, are available from matrix $H_{m2}$ and from message information u. Further calculations may provide $D_m = ET^{-1} B$. Since $D_m$ can be available from matrix $H_{m1}$, $D_{m2}$ can also be available and $D_{m2}$ is a modified version of $D_m$, $D_{m2}$ is may not need to be stored for encoding operations. Thus, alternatively, the encoder may store (e.g., store in a memory) only matrix $H_{m2}$ and $C_{m2}^{-1}$ and $T^{-1}$ (without storing $D_{m2}$). During encoding, the encoder may access a memory to retrieve entries of matrix $H_{m2}$ and $C_{m2}^{-1}$ and $T^{-1}$ to generate parity $p_1$ and $p_2$ based on Equations (2) and (3) and generate codewords $Vm = [p_1\ p_2\ u]$.

As a comparison, a traditional encoding may store sub-matrix P of generator matrix $G_m$. Sub-matrix P has a size k×(n−k). In the encoding described herein, each of sub-matrices $C_{m2}^{-1}$ and $D_{m2}$ and $T^{-1}$ of matrix $H_{m2}$ has a size smaller than the size of sub-matrix P.

Figure 7:
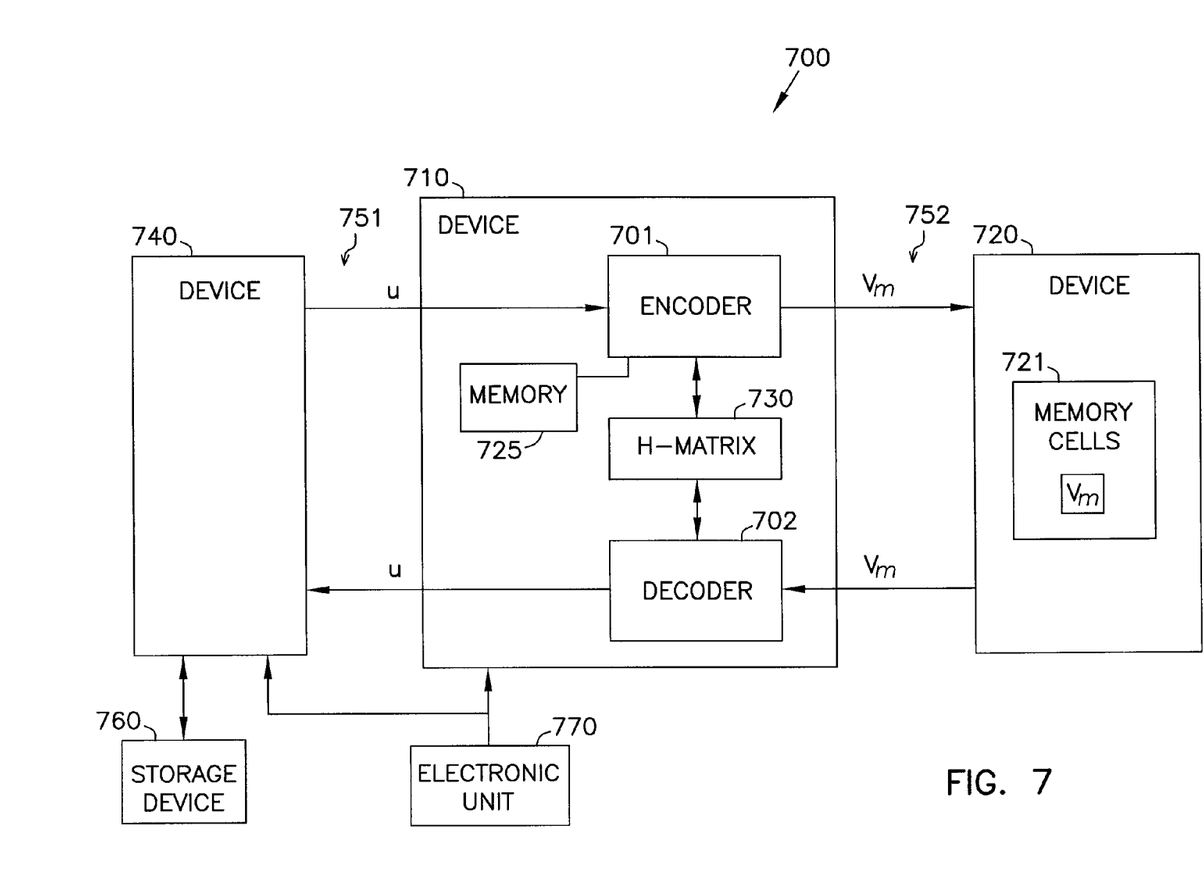
FIG. 7 shows a block diagram of a system including an encoder, according to an embodiment of the invention.

FIG. 7 shows a block diagram of a system 700 including an encoder 701, according to an embodiment of the invention. Encoder 701 can correspond to encoder 101 of FIG. 1. For example, encoder 701 can be realized in the form of an LDPC encoder that generates codewords $V_m$ from message information u with respect to an H-matrix 730. H-matrix 730 can be stored internally in system 700 or external to system 700.

System 700 can be a memory system having memory devices to store information. For example, system 700 can include a device 710, which can include a memory controller, to control a transfer of information to and from a device 720, which can include a memory device.

As shown in FIG. 7, the information transferred to device 720 can include codewords $V_m$, which can correspond to codewords $V_m$ described above with reference to FIG. 1 through FIG. 6. Device 720 can include memory cells 721. Device 720 can receive codewords $V_m$ from device 710 during a write operation and store codewords $V_m$ in memory cells 721. Device 720 can also include a read operation to output codewords $V_m$ to device 710. Memory cells 721 can include volatile memory cells, non-volatile memory cells, or both. Examples of volatile memory cells include random-access memory (RAM) cells. Examples of non-volatile memory cells include flash memory cells, resistive random-access memory (RRAM) cells, and phase change memory cells, and other types of non-volatile memory cells.

System 700 can store parameters associated with encoding operations in one or both of memory 725 of device 710 and memory cells 721 of device 720. These parameters can include tracking records, such as the tracking records described above with reference to FIG. 4 through FIG. 6. A decoder 702 of device 710 may use the stored parameters and H-matrix 730 to decode codewords $V_m$ (received from device 720) to obtain the original message information u.

System 700 can also include a device 740, which can include a processor, such as general purpose processor, or an application specific integrated circuit (ASIC). In an operation, e.g., a write operation of device 720, device 710 may receive message information u at its input, which is coupled to interface 751. Device 710 may generate codewords $V_m$ having message information u and provide codewords $V_m$ to its output, which is coupled to interface 752. In another operation, e.g., a read operation of device 720, device 710 may receive codewords $V_m$ output from device 720 via interface 752, decode codewords $V_m$ to obtain message information u, and then send message information u to device 740 via interface 751. Interfaces 751 can include a wired interface or a wireless interface or a combination of both. Interfaces 752 can include a wired interface or a wireless interface or a combination of both. Each of interfaces 751 and 752 can include a bi-directional interface. For example, interface 752 can include bi-directional conductors (e.g., a serial bus or a parallel bus) to transfer codewords $V_m$ to and from device 720 on the same bi-directional conductors.

System 700 can also include a storage device 760. A portion of storage device 760 or entire memory 725 can be external to system 700. Storage device 760 can include any form of computer-readable storage medium comprising instructions, which when implemented by one or more processors (e.g., a processor in a computer or in a wireless communication device) or by device 710 or 740, can perform all operations or a part of operations associated with generation of codewords $V_m$ described herein. For example, storage device 760 can include instructions to generate matrices, such as matrices $H_m$, $H_{m1}$, and $H_{m2}$, to calculate equations, such as Equations (1), (2), and (3), and to generate tracking records (e.g., rows and columns exchange) described above with reference to FIG. 1 through FIG. 6. The processor that performs the instructions stored in storage device 760 can be included in system externally from system 700. For example, such processor can be a part of a computer different from system 700.

Alternatively or in addition to storage device 760, an electronic unit 770 can operate to generate matrices, such as matrices $H_m$, $H_{m1}$, and $H_{22}$, to calculate equations, such as Equations (1), (2), and (3), and to generate tracking records (e.g., rows and columns exchange) described above with reference to FIG. 1 through FIG. 6. For example, electronic unit 770 may receive input information associated with parity check matrix H. Then, based on the input information, electronic unit 770 may generate output information, such as matrices $H_m$, $H_{m1}$, and $H_{m2}$, tracking record, and Equations 1, 2, and 3. At least some of the information (e.g., at least some of the information included in matrices $H_m$, $H_{m1}$, and $H_{m2}$, Equations (1), (2), and (3), and the tracking records) generated by the electronic unit 770 can be used by encoder 701 to generate codewords $V_m$ and used by decoder 702 to decode codewords $V_m$.

A portion of system 700 (e.g., devices 710 and 720) or all of system 700 can be included in the same semiconductor chip, in the same integrated circuit package, or in the same circuit board.

The illustrations of apparatus (e.g., apparatus 100) and systems (e.g., system 700) are intended to provide a general understanding of the structure of various embodiments and are not intended to provide a complete description of all the elements and features of apparatus and systems that might make use of the structures described herein.

Any of the components described above with reference to FIG. 1 through FIG. 7 can be implemented in a number of ways, including simulation via software. Thus, apparatus (e.g., apparatus 100) and systems (e.g., system 700) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., apparatus 100) and as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The apparatus and systems of various embodiments may include or be included in electronic circuitry used in high-speed computers, communication and signal processing circuitry, single or multi-processor modules, single or multiple embedded processors, multi-core processors, message information switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 7 include apparatus and methods for encoding message information. Such apparatus and methods can include using a parity check matrix of a low-density parity check (LDPC) code and to generate a first matrix having an upper triangular sub-matrix. Parity information to encode the message information can be generated based on the first matrix if a total number of rows of the upper triangular sub-matrix is equal to the rank of the parity check matrix. If the total number of rows of the upper triangular sub-matrix is less than the rank of the parity check matrix, then a triangularization operation can be performed in a second sub-matrix in a second portion of the first matrix to form a second matrix. Parity information to encode the message information can be generated based on the second matrix. The encoding described herein can combine the parity information and the message information can be combined to form codewords. Decoding of the codewords can also be performed. For example, processes (e.g., steps) performed during encoding to generate the parity information can be performed in a reversed order to generate decoded information. Then, the same H-matrix used for encoding can be used during decoding to generate the original message information. Other embodiments including additional apparatus and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A method comprising:
receiving message information;
generating parity information based on an equation calculated from at least an inverse of a triangular sub-matrix and a second sub-matrix, the triangular sub-matrix generated from a first portion of a parity check matrix of a low-density parity check code, the second sub-matrix generated from a second portion of the parity check matrix, wherein the equation includes $p=T^{-1}(Bu)$, wherein p denotes the parity information, $T^{-1}$ denotes the inverse of the triangular sub-matrix, B denotes the second sub-matrix, and u denotes the message information;
storing a record linking a position number of at least one column of the triangular sub-matrix with a position number of at least one column of the parity check matrix; and
generating a codeword based at least in part on the parity information.

2. The method of claim 1, further comprising:
accessing a memory to retrieve entries of the inverse of the triangular sub-matrix.

3. The method of claim 1, wherein the codewords include a combination of the message information and the parity information.

4. The method of claim 1, further comprising:
decoding the codeword to retrieve the message information.

5. A method comprising:
receiving message information;
generating a portion of parity information based on a first equation calculated from at least an inverse of a first sub-matrix in a first portion of a matrix, the first sub-matrix including a diagonal entry having a value of one;
generating an additional portion of the parity information based on a second equation calculated from at least a triangular sub-matrix in a second portion of the matrix; and
generating codewords based at least in part on the portion of the parity information and the additional portion of the parity information, wherein the first equation includes $p_2=(C_{m2}^{-1}D_{m2})u$, the second equation includes $p_1=T^{-1}(A_{m2}p_2+B_{m2}u)$, wherein $p_1$ and $p_2$ denote the portion and the additional portion of the parity information, $C_{m2}$ denotes the first sub-matrix T denotes the triangular sub-matrix, and $A_{m2}$, $B_{m2}$, and $D_{m2}$ denote other sub-matrices of the matrix the matrix having a block structure $$\begin{bmatrix} T & A_{m2} & B_{m2} \\ 0 & C_{m2} & D_{m2} \end{bmatrix}.$$

6. The method of claim 5, wherein the codewords include a combination of the portion of the parity information, the additional portion of the parity information, and the message information.

7. A method comprising:
generating a first matrix from a parity check matrix of a low-density parity check code, the first matrix having a triangular sub-matrix in a first portion of the first matrix;
generating parity information to encode message information based at least in part on the first matrix if a total number of rows of the triangular sub-matrix is equal to a rank of the parity check matrix; and
if the total number of rows of the first triangular sub-matrix is less than the rank of the parity check matrix, performing a triangularization operation on a second sub-matrix in a second portion of the first matrix to generate a second matrix, and generating parity information to encode the message information based at least in part on the second matrix, wherein generating the parity information to encode the message information based at least in part on the second matrix is based on an equation $p_2=(C_{m2}^{-1}D_{m2})u$, wherein $p_2$ denotes a portion of the parity information, $C_{m2}^{-1}$ denotes an inverse of a first sub-matrix in the second matrix, $D_{m2}$ denotes a second sub-matrix in the second matrix, and u denotes the message information.

8. A method comprising:
generating a first matrix from a parity check matrix of a low-density parity check code, the first matrix having a triangular sub-matrix in a first portion of the first matrix;
generating parity information to encode message information based at least in part on the first matrix if a total number of rows of the triangular sub-matrix is equal to a rank of the parity check matrix; and
if the total number of rows of the first triangular sub-matrix is less than the rank of the parity check matrix, performing a triangularization operation on a second sub-matrix in a second portion of the first matrix to generate a second matrix, and generating parity information to encode the message information based at least in part on the second matrix, wherein generating the parity information to encode the message information based at least in part on the first matrix is based on an equation $p=T^{-1}(Bu)$, wherein p denotes the parity information, $T^{-1}$ denotes an inverse of the triangular sub-matrix, B denotes a sub-matrix in a third portion of the first matrix, and u denotes message information.

9. The method of claim 7, wherein generating the parity information to encode the message information based at least in part on the second matrix is further based a second equation $p_1=T^{-1}(A_{m2}p_2+B_{m2}u)$, wherein $p_1$ denotes an additional portion of the parity information, $T^{-1}$ denotes an inverse of the triangular sub-matrix, $A_{m2}$ denotes third sub-matrix in the second matrix, and $B_{m2}$ denotes a fourth sub-matrix in the second matrix.

10. A method comprising:
generating a first matrix from a parity check matrix of a low-density parity check code, the first matrix having a triangular sub-matrix in a first portion of the first matrix;
generating parity information to encode message information based at least in part on the first matrix if a total number of rows of the triangular sub-matrix is equal to a rank of the parity check matrix; and
if the total number of rows of the first triangular sub-matrix is less than the rank of the parity check matrix, performing a triangularization operation on a second sub-matrix in a second portion of the first matrix to generate a second matrix, and generating parity information to encode the message information based at least in part on the second matrix, wherein generating the first matrix includes randomly selecting columns among a plurality of columns of the parity check matrix to generate the triangular sub-matrix.

11. The method of claim 10, wherein performing the triangularization operation on the second sub-matrix includes performing an arithmetic operation on at least one row of the second sub-matrix.

12. The method of claim 10, further comprising:
generating a record linking a position number of at least one column of the triangular sub-matrix with a position number of at least one column of the parity check matrix.

13. The method of claim 7, wherein generating the first matrix includes performing at least one of exchanging only rows of the parity check matrix, exchanging only columns of the parity check matrix, and exchanging only rows and columns of the parity check matrix.

14. The method of claim 7, wherein generating the first matrix includes performing no arithmetic operations on the rows of the parity check matrix.

15. The method of claim 7, wherein the parity check matrix is a rank-deficient matrix.

16. The method of claim 7, wherein the triangular sub-matrix is an upper triangular sub-matrix.

17. A method comprising:
performing a first triangularization operation on parity check matrix of a low-density parity check code to generate a first matrix having a triangular sub-matrix in a first portion of the first matrix, the triangular sub-matrix having a total number of rows less than a rank of the parity check matrix;
performing a second triangularization operation on at least a portion of a sub-matrix in a second portion of the first matrix such that at least one row of the first matrix includes all zeros entries;
removing the at least one row of the first matrix that includes all zero entries to generate a second matrix, wherein at least one of performing the first triangularization, performing the second triangularization, and removing the at least one row of the first matrix is performed by an electronic unit; and
calculating at least one equation to generate at least a portion of parity information based at least in part on the second matrix, wherein the first matrix includes sub-matrices T, A, B, $C_{m1}$, $D_{m1}$, and 0 arranged in a block structure $$\begin{bmatrix} T & A & B \\ 0 & C_{m1} & D_{m1} \end{bmatrix},$$

wherein T denotes the triangular sub-matrix and $C_{m1}$ denotes the sub-matrix in the second portion of the first matrix.

18. The method of claim 17, wherein the second matrix is arranged in a block structure $$\begin{bmatrix} T & A_{m2} & B_{m2} \\ 0 & C_{m2} & D_{m2} \end{bmatrix},$$

wherein sub-matrices $A_{m2}$, $B_{m2}$, $C_{m2}$, and $D_{m2}$ are modified versions from sub-matrices A, B, $C_{m1}$, and $D_{m1}$, respectively, of the first matrix resulting from the triangularization operation performed on the sub-matrix in the second portion of the first matrix.

19. The method of claim 18, wherein forming the at least one equation includes:
forming a first equation $p_2 = (C_{m2}^{-1} D_{m2})u$, wherein $p_2$ denotes a portion of the parity information, and u denotes the message information; and
forming a second equation $p_1 = T^{-1}(A_{m2}p_2 + B_{m2}u)$, wherein $p_1$ denotes another portion of the parity information.

20. A method comprising:
performing a first triangularization operation on parity check matrix of a low-density parity check code to generate a first matrix having a triangular sub-matrix in a first portion of the first matrix, the triangular sub-matrix having a total number of rows less than a rank of the parity check matrix;
performing a second triangularization operation on at least a portion of a sub-matrix in a second portion of the first matrix such that at least one row of the first matrix includes all zeros entries;
removing the at least one row of the first matrix that includes all zero entries to generate a second matrix, wherein at least one of performing the first triangularization, performing the second triangularization, and removing the at least one row of the first matrix is performed by an electronic unit; and
calculating at least one equation to generate at least a portion of parity information based at least in part on the second matrix, wherein performing the first triangularization operation includes randomly selecting columns among a plurality of columns of the parity check matrix to form at least a portion of columns of the triangular sub-matrix using the selected columns.

21. The method of claim 20, wherein performing the second triangularization operation includes performing an arithmetic operation on at least one row of the sub-matrix in the second portion of the first matrix.

22. The method of claim 17, wherein the triangular sub-matrix is an upper triangular sub-matrix.

23. The method of claim 22, wherein performing the second triangularization operation includes performing an upper triangularization operation.

24. A method comprising:
performing a first triangularization operation on parity check matrix of a low-density parity check code to generate a first matrix having a triangular sub-matrix in a first portion of the first matrix, the triangular sub-matrix having a total number of rows less than a rank of the parity check matrix;
performing a second triangularization operation on at least a portion of a sub-matrix in a second portion of the first matrix such that at least one row of the first matrix includes all zeros entries;
removing the at least one row of the first matrix that includes all zero entries to generate a second matrix, wherein at least one of performing the first triangularization, performing the second triangularization, and removing the at least one row of the first matrix is performed by an electronic unit;
calculating at least one equation to generate at least a portion of parity information based at least in part on the second matrix; and
generating a record linking position numbers of columns of at least a portion of the first matrix, at least a portion of the second matrix, and at least a portion of the parity check matrix.

25. A method comprising:
generating a matrix from a parity check matrix of a low-density parity check code, the parity check matrix having a size (n−k+m)×n and a rank R where R is less than (n−k+m), the matrix having a size R×n and having sub-matrices T and B arranged in a block structure [T B], the sub-matrix B having a size R×(n−R), wherein the sub-matrix T is a triangular sub-matrix having a size R×R; and forming an equation based at least in part on an inverse of the triangular sub-matrix to generate parity information, wherein generating the matrix includes randomly selecting a column among a plurality of columns of the parity check matrix, and exchanging a position of the selected column with a position of an additional column of the plurality of columns to generate a column of the sub-matrix T, such that the sub-matrix T includes the selected column, and wherein at least one of generating a matrix and forming the equation is performed by an electronic unit.

26. The method of claim 25, wherein the equation includes $p=T^{-1}(Bu)$, wherein u denotes message information, and p denotes parity information associated with the message information.

27. The method of claim 25, further comprising: generating a record tracking a position number of the selected column relative to a position number of a column of the parity check matrix.

28. An apparatus comprising:
an input to receive message information;
an encoder to generate codewords having the message information and parity information, and to generate the parity information based on an equation calculated from a combination of at least an inverse of a triangular sub-matrix generated from a first portion of a parity check matrix of a low-density parity check code and a sub-matrix generated from a second portion of the parity check matrix; and
an output to provide the codewords, wherein the apparatus is configured to store a record linking a position number of at least one column of the triangular sub-matrix with a position number of at least one column of the parity check matrix.

29. The apparatus of claim 28, wherein the equation includes $p=T^{-1}(Bu)$, wherein p denotes the parity information, $T^{-1}$ denotes the inverse of the triangular sub-matrix, B denotes the sub-matrix generated from the second portion of the parity check matrix, and u denotes the message information.

30. The apparatus of claim 28, wherein the encoder is configured to store entries of the inverse of the triangular sub-matrix.

31. The apparatus of claim 28, wherein the encoder is included in a memory device coupled to receive the codewords, the memory device including memory cells to store the codewords.

32. The apparatus of claim 31, wherein the memory device is configured to output the codewords in a read operation of the memory device.

33. The apparatus of claim 32, wherein the input and the output comprise a bi-directional interface of the memory device.

34. An apparatus comprising:
an input to receive message information; and
a module to generate codewords having the message information and parity information, the module configured to generate a portion of the parity information based on a first equation calculated from at least an inverse of a first sub-matrix in a first portion of a matrix, the first sub-matrix including a diagonal entry having a value of one, the module also configured to generate an additional portion of the parity information based on a second equation calculated from at least a triangular sub-matrix in a second portion of the matrix; and
an output to provide the codewords, wherein the first equation includes $p_2=(C_{m2}^{-1}D_{m2})u$, the second equation includes $p_1=T^{-1}(A_{m2}+B_{m2}u)$ wherein $p_1$ and $p_2$ denote the portions of the parity information, $C_{m2}$ denotes the first sub-matrix in the first portion of a matrix, $T^{-1}$ denotes an inverse of the triangular sub-matrix, and $A_{m2}$, $B_{m2}$ and $D_{m2}$ denote other sub-matrices of the matrix the matrix having a block structure $$\begin{bmatrix} T & A_{m2} & B_{m2} \\ 0 & C_{m2} & D_{m2} \end{bmatrix}.$$

35. The apparatus of claim 34, wherein the module is configured to store entries of the inverse of the triangular sub-matrix, and entries of the inverse of the first sub-matrix in the first portion of a matrix.

36. The apparatus of claim 34, wherein the module is configured to store entries of a parity check matrix of a low-density parity check code, and wherein the matrix is generated from the parity check matrix.

37. An apparatus comprising:
an input to receive message information; and
a module to generate codewords having the message information and parity information, the module configured to generate a portion of the parity information based on a first equation calculated from at least an inverse of a first sub-matrix in a first portion of a matrix, the first sub-matrix including a diagonal entry having a value of one, the module also configured to generate an additional portion of the parity information based on a second equation calculated from at least a triangular sub-matrix in a second portion of the matrix; and
an output to provide the codewords, wherein the module is configured to store a record linking at least a portion of column numbers of the matrix with at least a portion of column numbers the parity check matrix.

38. The apparatus of claim 34, wherein the module comprises a memory device having memory cells to store the codewords.

39. A non-transitory computer-readable storage medium comprising instructions, which when implemented by one or more processors perform the following operations:
generate a first matrix from a parity check matrix of a low-density parity check code, the first matrix having a triangular sub-matrix in a first portion of the first matrix;
generate parity information to encode message information based at least in part on the first matrix if a total number of rows of the triangular sub-matrix is equal to the rank of the parity check matrix; and
if the total number of rows of the triangular sub-matrix is less than the rank of the parity check matrix, perform a triangularization operation on a second sub-matrix in a second portion of the first matrix to generate a second matrix, and generate parity information to encode the message information based at least in part on the second matrix, wherein generating the parity information to encode the message information based at least in part on the second matrix is based on an equation $p_2=(C_{m2}^{-1}D_{m2})u$, wherein $p_2$ denotes a portion of the parity information, $C_{m2}^{-1}$ denotes an inverse of a first sub-matrix in the second matrix, $D_{m2}$ denotes a second sub-matrix in the second matrix, and u denotes the message information.

40. The computer-readable storage medium of claim 39, wherein the operation to generate the first matrix includes randomly selecting columns among a plurality of columns of the parity check matrix to generate the triangular sub-matrix.

41. The computer-readable storage medium of claim 39, wherein the operation to perform a triangularization operation on the second sub-matrix includes performing an arithmetic operation on at least one row of at least the second portion of the first matrix.

42. The computer-readable storage medium of claim 41, wherein the operations further comprise:
- an operation to generate a record tracking a position number of at least one column of the triangular sub-matrix relative to a position number of at least one column of the parity check matrix.

* * * * *

UNITED STATES PATENT AND TRADEMARK OFFICE
CERTIFICATE OF CORRECTION

PATENT NO. : 8,839,069 B2  
APPLICATION NO. : 13/083341  
DATED : September 16, 2014  
INVENTOR(S) : Chandra C. Varanasi et al.

Page 1 of 1

It is certified that error appears in the above-identified patent and that said Letters Patent is hereby corrected as shown below:

In the Claims,

In column 11, line 48, in Claim 5, delete "sub-matrix" and insert -- sub-matrix, --, therefor.

In column 11, line 50, in Claim 5, delete "matrix" and insert -- matrix, --, therefor. (First Occurrence)

In column 12, line 40, in Claim 9, delete "a" and insert -- on a --, therefor.

In column 13, line 46, in Claim 17, delete "sub-matrix" and insert -- sub-matrix, --, therefor.

In column 16, line 1, in Claim 34, delete "$p_1=T^{-1}(A_{m2}+B_{m2}u)$" and insert -- $p_1=T^{-1}(A_{m2}p_2+B_{m2}u)$, --, therefor.

In column 16, line 5, in Claim 34, delete "$B_{m2}$" and insert -- $B_{m2}$, --, therefor.

In column 16, line 5, in Claim 34, delete "matrix" and insert -- matrix, --, therefor.

Signed and Sealed this  
Eighteenth Day of November, 2014

Michelle K. Lee  
*Deputy Director of the United States Patent and Trademark Office*